US012713813B2

(12) United States Patent
Kwon et al.

(10) Patent No.: US 12,713,813 B2
(45) Date of Patent: Aug. 18, 2026

(54) DISPLAY DEVICE WITH PROTECTIVE LAYER

(71) Applicant: Samsung Display Co., Ltd., Yongin-si (KR)

(72) Inventors: Ohjune Kwon, Yongin-si (KR); Seung-Yeon Chae, Yongin-si (KR); Seunggun Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 421 days.

(21) Appl. No.: 18/467,601

(22) Filed: Sep. 14, 2023

(65) Prior Publication Data

US 2024/0172531 A1 May 23, 2024

(30) Foreign Application Priority Data

Nov. 17, 2022 (KR) ........................ 10-2022-0154668

(51) Int. Cl.

| | |
|---|---|
| ***H10K 59/80*** | (2023.01) |
| ***H10K 50/844*** | (2023.01) |
| ***H10K 59/38*** | (2023.01) |
| ***H10K 59/40*** | (2023.01) |
| ***H10K 77/10*** | (2023.01) |
| ***H10K 102/00*** | (2023.01) |

(52) U.S. Cl.

CPC ........... *H10K 59/873* (2023.02); *H10K 59/38* (2023.02); *H10K 59/40* (2023.02); *H10K 77/111* (2023.02); *H10K 2102/351* (2023.02)

(58) Field of Classification Search

CPC ........... H10K 59/873; H10K 2102/311; H10K 50/844

See application file for complete search history.

(56) References Cited

U.S. PATENT DOCUMENTS

| | | | |
|---|---|---|---|
| 7,728,075 B2 | 6/2010 | Schellekens et al. | |
| 9,136,502 B2 | 9/2015 | Kwack et al. | |
| 9,685,620 B2 | 6/2017 | Namkung | |
| 9,887,386 B2 | 2/2018 | Park et al. | |
| 2021/0257583 A1* | 8/2021 | Park | H10K 50/87 |
| 2022/0155821 A1* | 5/2022 | Kim | G09G 3/03 |
| 2023/0174826 A1* | 6/2023 | Pang | C09J 7/385 359/507 |

FOREIGN PATENT DOCUMENTS

| | | |
|---|---|---|
| KR | 10-1015851 B1 | 2/2011 |
| KR | 10-1103194 B1 | 1/2012 |
| KR | 10-2345978 B1 | 12/2021 |
| KR | 10-2367251 B1 | 2/2022 |

* cited by examiner

*Primary Examiner* — Joseph L Williams

(74) *Attorney, Agent, or Firm* — Womble Bond Dickinson (US) LLP

(57) ABSTRACT

Provided is a display device including a display panel, and a protective layer contacting a rear surface of the display panel, and including a high modulus protective portion on the rear surface of the display panel, and a low modulus protective portion spaced from the rear surface of the display panel with the high modulus protective portion interposed therebetween.

18 Claims, 7 Drawing Sheets

DISPLAY DEVICE WITH PROTECTIVE LAYER

CROSS-REFERENCE TO RELATED APPLICATION

This application claims priority to, and the benefit of, Korean Patent Application No. 10-2022-0154668, filed on Nov. 17, 2022, in the Korean Intellectual Property Office, the entire contents of which are hereby incorporated by reference.

BACKGROUND

1. Field

The present disclosure herein relates to a display device for displaying an image.

2. Description of the Related Art

Multimedia electronic devices, such as a television, a mobile phone, a tablet computer, a navigation system, a game machine, and the like may include a display device for displaying an image. With the recent development of display device technology, various types of display devices have been developed. For example, a flexible display device that can be folded, rolled, or bent is being developed. The flexible display device may include a flexible substrate. However, the flexible substrate has a limitation in that it is vulnerable to an external impact and is damaged in a process of manufacturing the display device.

SUMMARY

The present disclosure provides a display device with improved reliability.

One or more embodiments of the present disclosure provide a display device including a display panel, and a protective layer contacting a rear surface of the display panel, and including a high modulus protective portion on the rear surface of the display panel, and a low modulus protective portion spaced from the rear surface of the display panel with the high modulus protective portion interposed therebetween.

The low modulus protective portion may contact a rear surface of the high modulus protective portion.

The high modulus protective portion and the low modulus protective portion may include an organic material.

The high modulus protective portion and the low modulus protective portion may include a same material, wherein a degree of curing of the high modulus protective portion is different from a degree of curing of the low modulus protective portion.

A thickness of the low modulus protective portion may be about 50% or less than a sum of a thickness of the high modulus protective portion and the thickness of the low modulus protective portion.

A variance in modulus in the low modulus protective portion in a thickness direction of the protective layer may be greater than a variance in modulus in the high modulus protective portion in the thickness direction of the protective layer.

The variance in modulus in the low modulus protective portion may be about 1.5 times greater than the variance in modulus in the high modulus protective portion.

The high modulus protective portion and the low modulus protective portion may be provided in plurality, wherein the high modulus protective portions and the low modulus protective portions are alternately arranged on the rear surface of the display panel.

One of the low modulus protective portions may define a rear surface of the protective layer.

The protective layer may further include a barrier layer including an inorganic material, and contacting the high modulus protective portion and the rear surface of the display panel.

The protective layer may further include an intermediate modulus protective portion between the high modulus protective portion and the low modulus protective portion, and having a modulus that is less than a modulus of the high modulus protective portion, and greater than a modulus of the low modulus protective portion.

The high modulus protective portion, the intermediate modulus protective portion, and the low modulus protective portion may be provided in plurality, wherein the high modulus protective portions, the intermediate modulus protective portions, and the low modulus protective portions are alternately arranged on the rear surface of the display panel along a thickness direction of the display panel.

The display panel may include a base substrate, pixels above the base substrate, and an encapsulation layer above the pixels.

The base substrate may include a synthetic resin layer.

The display device may further include an input-sensing layer above the display panel.

The display device may further include a color filter layer above the display panel.

In one or more embodiments of the present disclosure, a display device includes a flexible base substrate including an upper surface and a rear surface, light-emitting elements above the upper surface of the flexible base substrate, a barrier layer contacting the rear surface of the flexible base substrate, and including an inorganic material, a first protective portion contacting the barrier layer, and including an organic material, and a second protective portion below the first protective portion, and including an organic material, wherein a modulus of the second protective portion is less than a modulus of the first protective portion.

The modulus in the second protective portion may change along a thickness direction of the second protective portion by increasing toward the first protective portion.

A thickness of the second protective portion may be about 50% or less than a sum of a thickness of the first protective portion and the thickness of the second protective portion.

In one or more embodiments of the present disclosure, a display device includes a display panel, and a protective layer contacting a rear surface of the display panel, and including an upper portion below the rear surface of the display panel, and a lower portion below the upper portion, defining a rear surface of the protective layer, and having a lower modulus than a modulus of the upper portion.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain aspects of the present disclosure. In the drawings.

DETAILED DESCRIPTION

Figure 1:
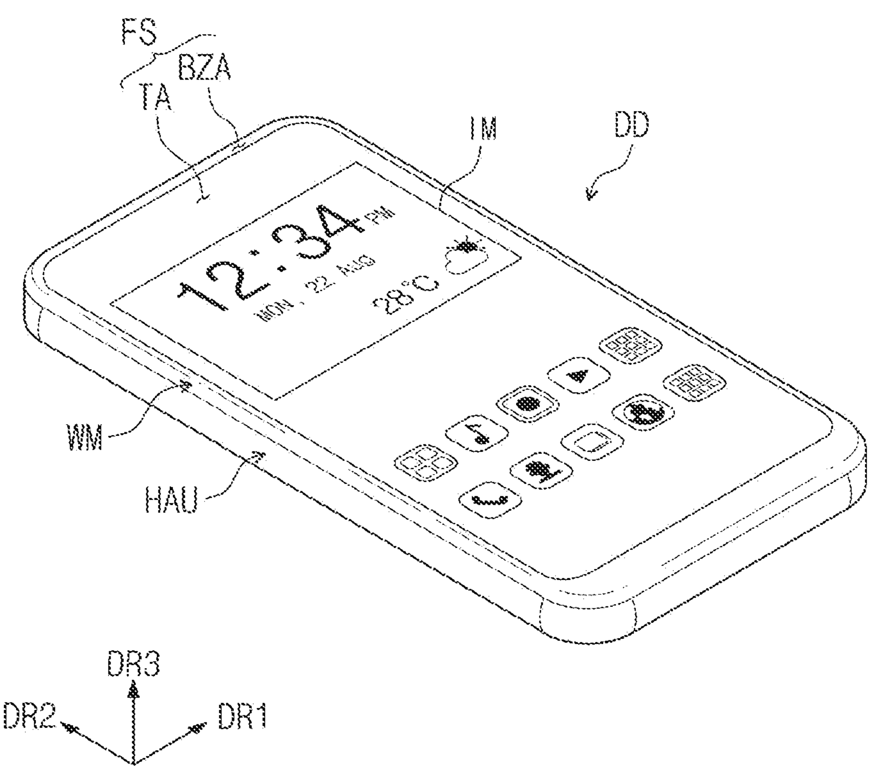
FIG. 1 is a perspective view of a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
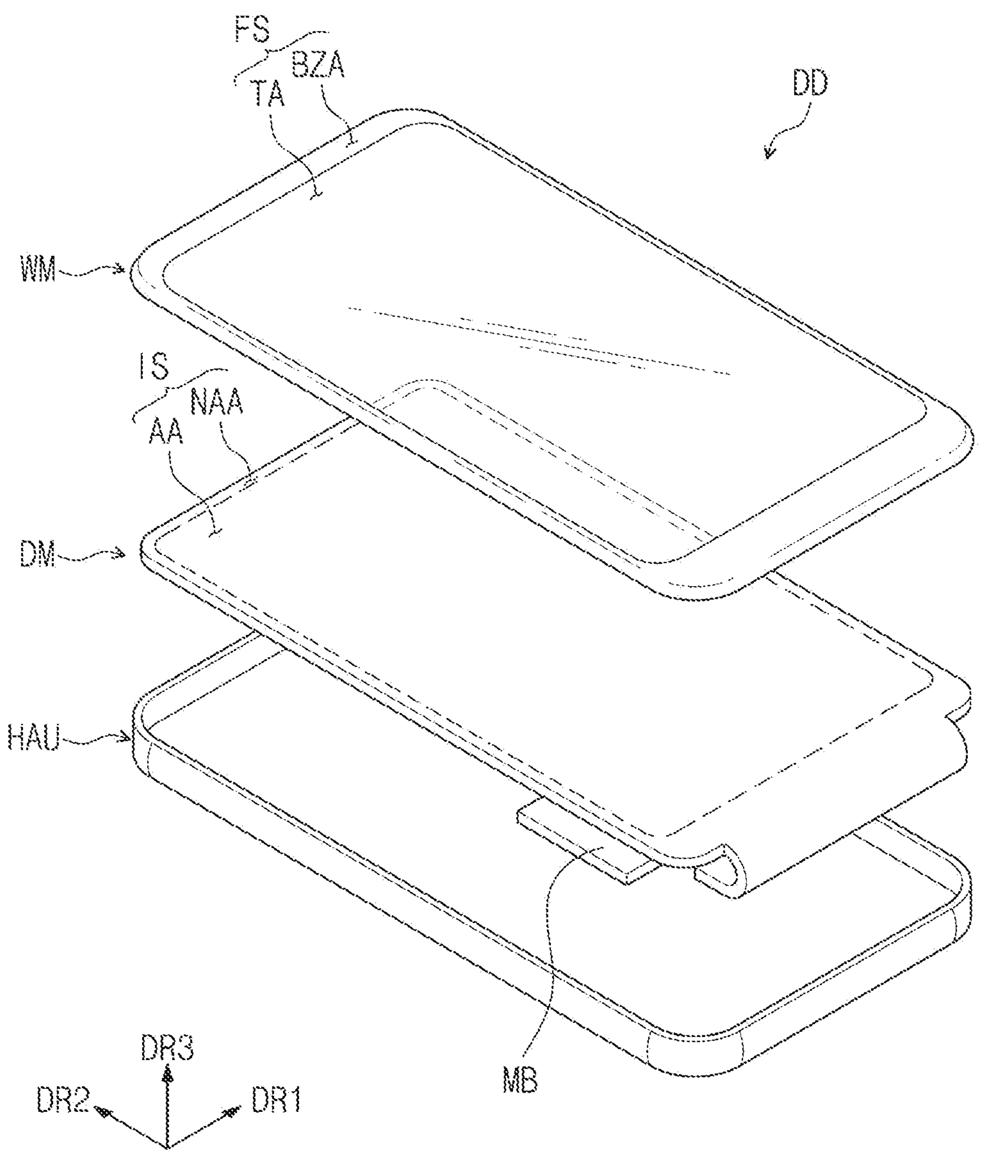
FIG. 2 is an exploded perspective view of a display device according to one or more embodiments of the present disclosure.

FIG. 1 is a perspective view of a display device DD according to one or more embodiments of the present disclosure. FIG. 2 is an exploded perspective view of the display device DD according to one or more embodiments of the present disclosure.

Referring to FIGS. 1 and 2, the display device DD may be activated according to an electrical signal, and may display an image IM. For example, the display device DD may include one or more devices, such as a monitor, a mobile phone, a tablet computer, a navigation system, and a game machine. However, the above-described embodiments of the display device DD are only examples, and the display device DD is not limited to any one embodiment as long as it does not depart from the concept of the present disclosure. A mobile phone is illustrated as an example of the display device DD.

When viewed in plan view, the display device DD may have a rectangular shape having short sides extending in a first direction DR1, and long sides extending in a second direction DR2 crossing the first direction DR1. Without being limited thereto, however, the display device DD may have various shapes, such as a circular shape and a polygonal shape on a plane.

A third direction DR3 may be defined as a direction perpendicular to a plane defined by the first and second directions DR1 and DR2. The front surface (or upper surface) and the rear surface (or lower surface) of each member constituting the display device DD may be opposed to each other in the third direction DR3, and a normal direction of each of the front and rear surfaces may be substantially parallel to the third direction DR3. A separation distance between the front and rear surfaces of the member defined along the third direction DR3 may correspond to a thickness of the member.

In this specification, the expression "on a plane" or "when viewed in plan view" may be defined as a state viewed from the third direction DR3. In this specification, the expression "on a cross section" may be defined as a state viewed from the first direction DR1 or the second direction DR2. Meanwhile, directions indicated by the first to third directions DR1, DR2, and DR3 are relative concepts, and may be converted into other directions.

The display device DD may be rigid or flexible. The expression "being flexible" means a property of being bendable, and a flexible structure may include anything from a completely foldable structure to a structure that can be bent to the level of several nanometers. For example, a flexible display device DD may include a curved device, a foldable device, or a rollable device.

The display device DD may display the image IM through a display surface FS parallel to each of the first and second directions DR1 and DR2. The image IM may include a still image and/or a dynamic image. FIG. 1 illustrates a clock and a plurality of icons as an example of the image IM.

The display surface FS of the display device DD may include only a flat surface, or may further include a curved surface bent from at least one side of the flat surface. The display surface FS may correspond to the front surface of the display device DD, which may correspond to the front surface of a window WM. Hereinafter, a same reference numeral will be used for the front surface FS of the window WM, as well as the display surface FS of the display device DD.

The display device DD according to one or more embodiments of the present disclosure may sense an external input applied from the outside. The external input may include various types of inputs, such as force, pressure, temperature, or light. The external input may include not only an input that makes contact with the display device DD, but also an input applied in proximity to the display device DD.

The display device DD may sense a user's input through the display surface FS defined on the front surface, and may respond to the sensed input signal. However, the region of the display device DD that senses an external input is not limited to the front surface of the display device DD, and may be changed according to the design of the display device DD. For example, the display device DD may sense a user's input applied to the side and/or rear surfaces of the display device DD.

The display device DD may include the window WM, a display module DM, and a housing HAU. The window WM and the housing HAU may be coupled to each other to form the exterior of the display device DD.

The window WM may be located on the display module DM. The window WM may cover the front surface IS of the display module DM, and may protect the display module DM from external impacts and scratches. The window WM may be coupled to the display module DM by an adhesive.

The window WM may include an optically transparent insulating material. For example, the window WM may include glass or synthetic resin as a base film. The window WM may have a single-layered or multi-layered structure. For example, the window WM may include synthetic resin films bonded together by an adhesive, or a glass film and a synthetic resin film bonded together by an adhesive. The window WM may further include a functional layer, such as an anti-fingerprint layer, a phase control layer, or a hard coating layer, which are located on the base film.

As described above, the front surface FS of the window WM may correspond to the front surface of the display device DD. The front surface FS of the window WM may include a transmission region TA and a bezel region BZA.

The transmission region TA may be an optically transparent region. The transmission region TA may transmit the image IM provided by the display module DM. The transmission region TA is illustrated as having a tetragonal shape, but the transmission region TA may have various shapes, and is not limited to any one embodiment.

The bezel region BZA may have a lower light transmittance than the transmission region TA. The bezel region BZA may correspond to a region in which a material having a color (e.g., predetermined color) is printed. The bezel region BZA may reduce or prevent transmission of light, and may reduce or prevent visibility of one configuration of the display module DM located to overlap the bezel region BZA.

The bezel region BZA may be adjacent to the transmission region TA. The shape of the transmission region TA may be substantially defined by the bezel region BZA. For example, the bezel region BZA may be located outside of, and may surround, the transmission region TA (e.g., in plan view). However, this is illustrated as an example, and the bezel region BZA may be adjacent to only one side of the transmission region TA, or may be located on a side surface of the display device DD (as opposed to the front surface). In addition, the bezel region BZA may be omitted.

The display module DM may be located between the window WM and the housing HAU. The display module DM may display the image IM, and may sense an external input. The image IM may be displayed on the front surface IS of the display module DM. The front surface IS of the display module DM may include an active region AA and a peripheral region NAA.

The active region AA may be activated according to an electrical signal. The active region AA may be a region in which the image IM is displayed. According to one or more embodiments of the present disclosure, the active region AA may be a region in which the external input is sensed. The active region AA may overlap at least a portion of the transmission region TA. Accordingly, a user may view the image IM displayed in the active region AA through the transmission region TA.

The peripheral region NAA may be adjacent to the active region AA. For example, the peripheral region NAA may surround the active region AA (e.g., in plan view). A driving circuit, a driving line, or the like for driving the active region AA may be located in the peripheral region NAA. The peripheral region NAA may overlap at least a portion of the bezel region BZA, and the bezel region BZA may reduce or prevent visibility of components located in the peripheral region NAA.

The display module DM may include a display panel configured to display the image IM. The display module DM may further include an input-sensing layer configured to sense the external input. A detailed description of the display module DM will be given later.

A portion of the display module DM may be bent with respect to a bending axis extending in the first direction DR1. That is, the portion of the display module DM may be bent toward the rear surface of the remaining portion of the display module DM, which corresponds to the active region AA. A circuit board MB may be connected to the portion of the bent display module DM, and the circuit board MB may overlap the display module DM when viewed in plan view.

The circuit board MB may be located on one side of the display module DM, and may be electrically connected to the display module DM. The circuit board MB may generate an electrical signal to be provided to the display module DM, or may receive a signal generated by the display module DM to calculate a resultant value including information on a location, at which the external input is sensed, or the intensity of the external input.

The housing HAU may be coupled to the window WM to provide an internal space for accommodating the display module DM and the circuit board MB. The housing HAU may include a material having relatively high rigidity. For example, the housing HAU may include a plurality of frames and/or plates composed of glass, plastic, or metal, or a combination thereof. The housing HAU may protect the components of the display device DD accommodated in the housing HAU by absorbing an impact applied from the outside, or by reducing or preventing foreign substances/moisture from entering from the outside.

Figure 3:
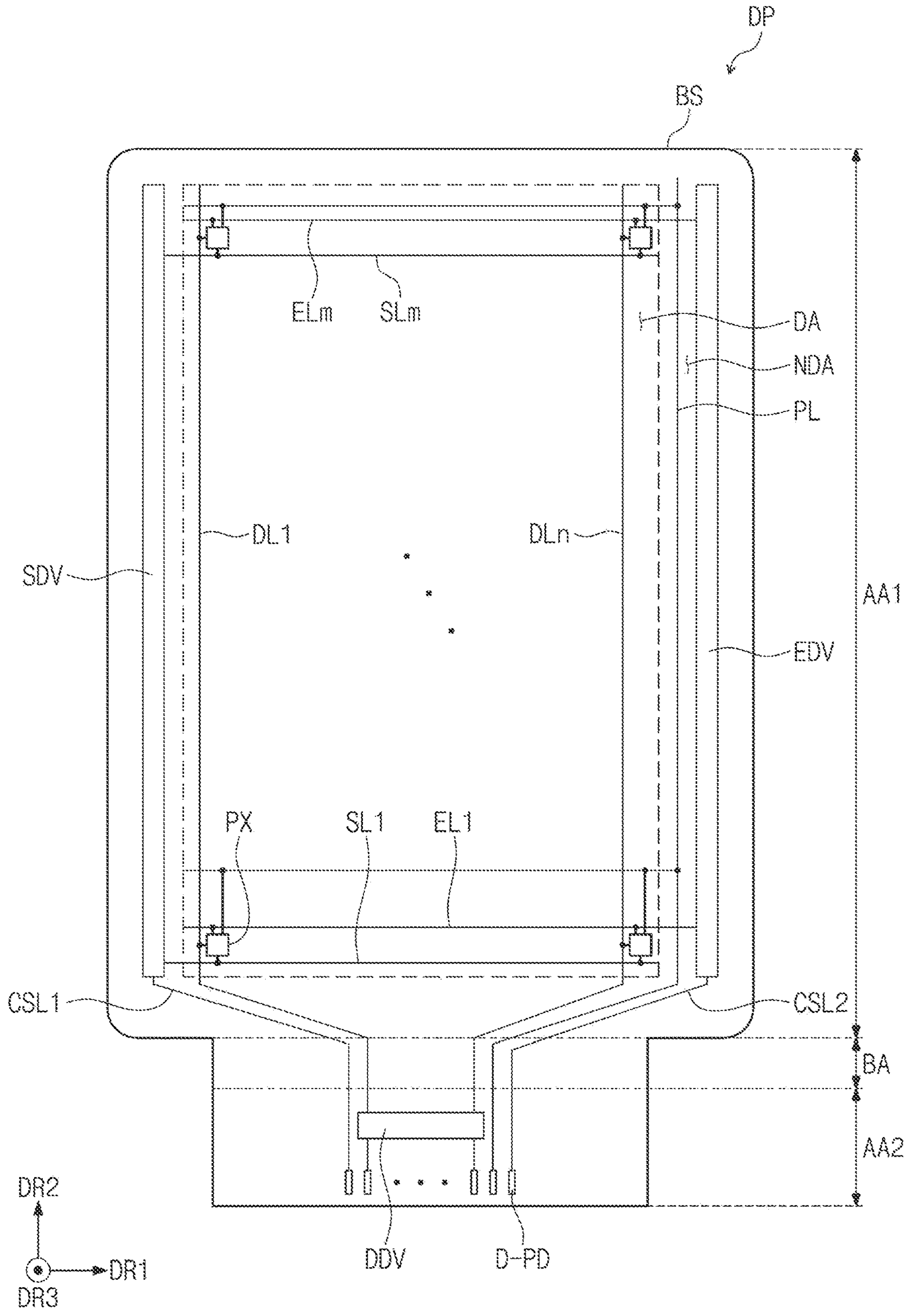
FIG. 3 is a plan view of a display panel according to one or more embodiments of the present disclosure.

FIG. 3 is a plan view of a display panel DP according to one or more embodiments of the present disclosure.

The display panel DP may be included in the display module DM (see FIG. 2), and may display an image according to an electrical signal. The display panel DP according to one or more embodiments of the present disclosure may be a light-emitting display panel, but is not particularly limited. For example, the display panel DP may be an organic light-emitting display panel, an inorganic light-emitting display panel, or a quantum dot light-emitting display panel. A light-emitting layer of the organic light-emitting display panel may include an organic light-emitting material, and a light-emitting layer of the inorganic light-emitting display panel may include an inorganic light-emitting material. A light-emitting layer of the quantum dot light-emitting display panel may include quantum dots and quantum rods. Hereinafter, the display panel DP will be described as an organic light-emitting display panel.

Referring to FIG. 3, the display panel DP may include a base substrate BS, pixels PX, signal lines SL1 to SLm, DL1 to DLn, EL1 to ELm, CSL1, CSL2, and PL electrically connected to the pixels PX, a scan driver SDV, a data driver DDV, a light-emitting driver EDV, and pads D-PD.

The base substrate BS may provide a base surface on which electrical elements and signal lines of the display panel DP are located. The base substrate BS may be a rigid substrate, or may be a flexible substrate capable of being bent, folded, or rolled. For example, the base substrate BS may include a glass substrate, a metal substrate, or a polymer substrate.

The base substrate BS may include a first base region AA1, a bending region BA, and a second base region AA2, which are divided in the second direction DR2. The bending region BA may extend from the first base region AA1 in the second direction DR2. The second base region AA2 may extend from the bending region BA in the second direction DR2. The first base region AA1 and the second base region AA2 may be spaced apart from each other with the bending region BA interposed therebetween.

The first base region AA1 may include a display region DA. The display region DA may be a region in which the light-emitting elements of the pixels PX are located to display an image. The display region DA may correspond to the active region AA (see FIG. 2) of the display module DM (see FIG. 2), and may overlap the transmission region TA (see FIG. 2).

The remaining portion of the first base region AA1, which excludes the display region DA portion of the first base region AA1, along with the bending region BA and the second base region AA2, may be defined as a non-display region NDA. The non-display region NDA may be adjacent to the display region DA, and may not display any image. The non-display region NDA may surround the display region DA. The scan driver SDV, the data driver DDV, and the light-emitting driver EDV, which are configured to drive the pixels PX, along with the pads D-PD, may be located in the non-display region NDA. The signal lines SL1 to SLm, DL1 to DLn, EL1 to ELm, CSL1, CSL2, and PL electrically connected to the pixels PX may extend to be located on the non-display region NDA.

The base substrate BS may be a flexible substrate, and the bending region BA of the base substrate BS may be bent with respect to a bending axis extending in the first direction DR1. That is, the bending region BA may be bent toward the rear surface of the display panel DP corresponding to the first base region AA1. As the bending region BA is bent, the second base region AA2 extending from one side of the bending region BA may overlap the first base region AA1 when viewed in plan view. That is, the second base region AA2 may be located on the rear surface of the display panel DP corresponding to the first base region AA1.

In the first direction DR1, the respective widths of the bending region BA and the second base region AA2 may be less than that of the first base region AA1. Because the bending region BA has a smaller width than the first base region AA1 in a direction of the bending axis, the bending region BA may be easily bent. However, this is illustrated as an example, and at least one of the widths of the bending region BA or the second base region AA2 in the first direction DR1 may be the same as the width of the first base region AA1 in the first direction DR1, and the present disclosure is not limited to any one embodiment.

The second base region AA2 may be a region in which the pads D-PD and the data driver DDV are located. The second base region AA2 may be a portion to which the circuit board MB (see FIG. 2) is connected. As the bending region BA is bent, the circuit board MB (see FIG. 2) connected to the second base region AA2 may be positioned on the rear surface of the display panel DP. As the second base region AA2 and the circuit board MB (see FIG. 2) are positioned below the first base region AA1 on the front surface of the display panel DP, the bezel area of the display device DD (see FIG. 2) may be reduced.

Each of the pixels PX may include a pixel-driving circuit including transistors (e.g., a switching transistor, a driving transistor, etc.) and at least one capacitor, and a light-emitting element connected to the pixel-driving circuit. The pixels PX may generate light in response to electrical signals respectively applied to the pixels PX, and may display the image through the display region DA. According to one or more embodiments of the present disclosure, some of the pixels PX may include transistors located in the non-display region NDA, but the present disclosure is not limited thereto.

The scan driver SDV and the light-emitting driver EDV may be located in the non-display region NDA corresponding to the first base region AA1. The data driver DDV may be located in the non-display region NDA corresponding to the second base region AA2. In one or more embodiments of the present disclosure, the data driver DDV may be provided in the form of an integrated circuit chip mounted in the non-display region NDA of the display panel DP. Without being limited thereto, however, the data driver DDV may be mounted on the circuit board MB (see FIG. 2).

The signal lines SL1 to SLm, DL1 to DLn, EL1 to ELm, CSL1, CSL2, and PL may include scan lines SL1 to SLm, data lines DL1 to DLn, light-emitting lines EL1 to ELm, first and second control lines CSL1 and CSL2, and a power line PL, wherein m and n are natural numbers.

When viewed in plan view, the data lines DL1 to DLn may be insulated from, and may cross, the scan lines SL1 to SLm and the light-emitting lines EL1 to ELm. For example, the scan lines SL1 to SLm may extend in the first direction DR1 to be connected to the scan driver SDV. The data lines DL1 to DLn may extend in the second direction DR2 to be connected to the data driver DDV. The light-emitting lines EL1 to ELm may extend in the first direction DR1 to be connected to the light-emitting driver EDV.

The power line PL may include a portion extending in the first direction DR1 and a portion extending in the second direction DR2. The portion extending in the first direction DR1 and the portion extending in the second direction DR2 may be located on different layers, and may be connected through a contact hole, or (without being limited thereto) they may be located on a same layer as each other, and integrally connected to each other. The power line PL may provide a first voltage to the pixels PX.

The first control line CSL1 may be connected to the scan driver SDV. The second control line CSL2 may be connected to the light-emitting driver EDV.

The pads D-PD may be located adjacent to the lower end of the second base region AA2. The pads D-PD may be located closer to the lower end of the base substrate BS than the data driver DDV. The pads D-PD may be spaced apart from each other along the first direction DR1. Each of the power line PL, the first control line CSL1, the second control line CSL2, and the data lines DL1 to DLn may be electrically connected to a corresponding pad D-PD among the pads D-PD.

The scan driver SDV may generate scan signals in response to a scan control signal. The scan signals may be applied to the pixels PX through the scan lines SL1 to SLm.

The data driver DDV may generate data voltages corresponding to image signals in response to a data control signal. The data voltages may be applied to the pixels PX through the data lines DL1 to DLn.

The light-emitting driver EDV may generate light-emitting signals in response to a light-emitting control signal. The light-emitting signals may be applied to the pixels PX through the light-emitting lines EL1 to ELm.

The pixels PX may receive the data voltages in response to the scan signals. The pixels PX may generate the image by emitting light having a luminance corresponding to the data voltages in response to the light-emitting signals. The light-emitting time of the pixels PX may be controlled by the light-emitting signals.

Figure 4A:
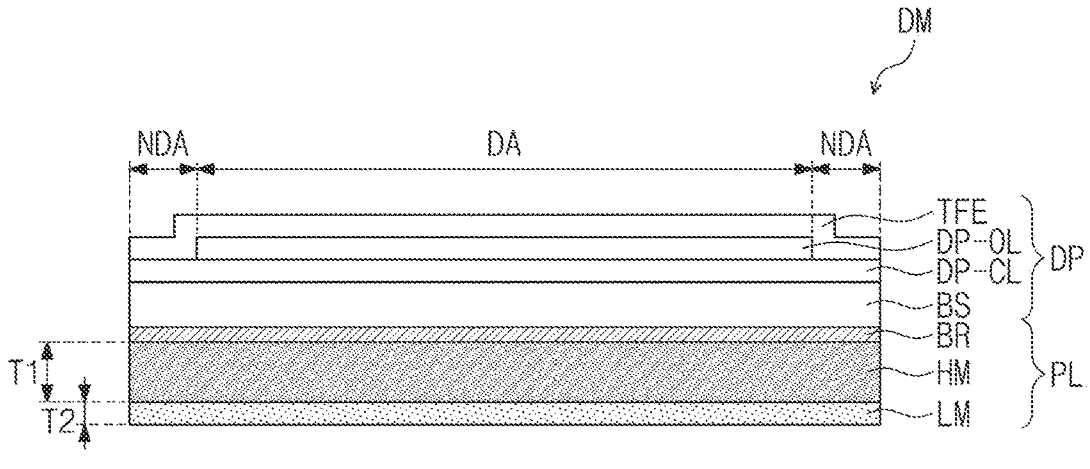
FIGS. 4A and 4B are cross-sectional views of a display module according to one or more embodiments of the present disclosure.
Figure 4A:
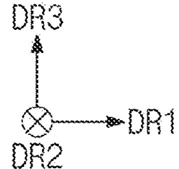
Figure 4B:
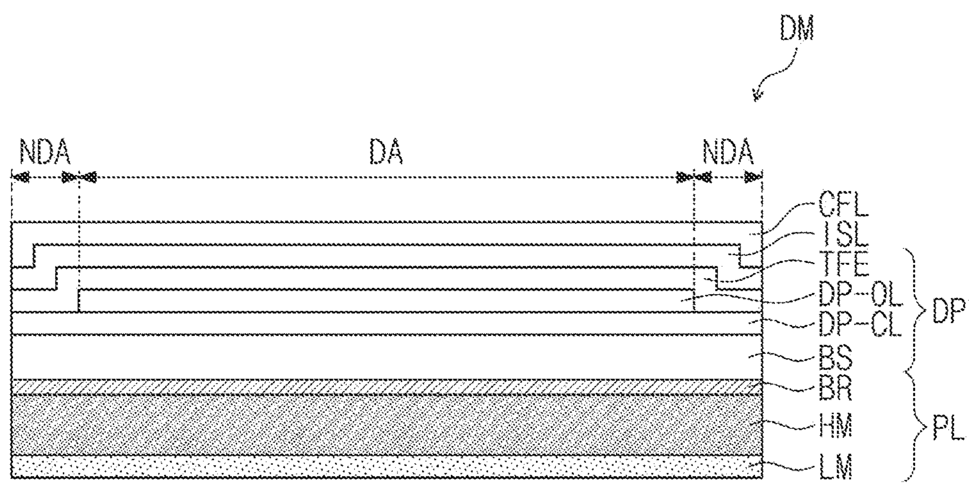
Figure 4B:
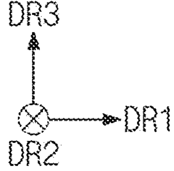

FIGS. 4A and 4B are cross-sectional views of a display module DM according to one or more embodiments of the present disclosure.

Referring to FIGS. 4A and 4B, the display module DM may include a display panel DP and a protective layer PL. The display panel DP may include a base substrate BS, a circuit layer DP-CL, a display element layer DP-OL, and an encapsulation layer TFE.

The base substrate BS may have a single-layered or multi-layered structure. The base substrate BS may include an inorganic layer, an organic layer, or a composite material layer. For example, the multi-layered base substrate BS may include synthetic resin layers and a multi-layered or single-layered inorganic layer located between the synthetic resin layers. The synthetic resin layer may include an acrylic-based resin, a methacrylic-based resin, polyisoprene, a vinyl-based resin, an epoxy-based resin, a urethane-based resin, a cellulose-based resin, a siloxane-based resin, a polyamide-based resin, a perylene-based resin, or the like. However, the material of the base substrate BS is not limited to the above examples.

The circuit layer DP-CL may be located on the base substrate BS. The circuit layer DP-CL may include the signal lines SL1 to SLm, DL1 to DLn, EL1 to ELm, CSL1, CSL2, and PL (see FIG. 3), the pads D-PD (see FIG. 3), and an insulating pattern, a semiconductor pattern, and a conductive pattern which form the pixel-driving circuit of the pixels PX (see FIG. 3). In the manufacturing step of the display panel DP, an insulating layer, a semiconductor layer, and a conductive layer may be formed on the base substrate BS through coating, deposition, or the like, and then the insulating layer, the semiconductor layer, and the conductive layer may be patterned through multiple photolithography processes to form the circuit layer DP-CL.

The display element layer DP-OL may be located on the circuit layer DP-CL. The display element layer DP-OL may include light-emitting elements that are located in the display region DA and that emit light. For example, the light-emitting elements may include an organic light-emitting element, an inorganic light-emitting element, a micro light-emitting diode (LED), a nano LED, or the like. The light-emitting elements of the display element layer DP-OL may be electrically connected to the pixel-driving circuit of the circuit layer DP-CL, and may emit light according to an electrical signal.

The encapsulation layer TFE may be located on, and may seal, the display element layer DP-OL. The encapsulation layer TFE may include at least one thin film to improve the optical efficiency of the display element layer DP-OL, or to protect the display element layer DP-OL. For example, the encapsulation layer TFE may include at least one of an inorganic film or an organic film. The inorganic film of the encapsulation layer TFE may protect the display element layer DP-OL from moisture/oxygen. The organic film of the encapsulation layer TFE may protect the display element layer DP-OL from foreign substances, such as dust particles.

The inorganic film of the encapsulation layer TFE may include at least one of aluminum oxide, titanium oxide, silicon oxide, silicon nitride, silicon oxynitride, zirconium oxide, or hafnium oxide. The organic film of the encapsulation layer TFE may include an acryl-based resin. However, the material of the encapsulation layer TFE is not limited to the above examples.

The protective layer PL may be located on the rear surface of the display panel DP. The protective layer PL may be located directly on the rear surface of the display panel DP. That is, the protective layer PL may be located to be in contact with the rear surface of the display panel DP without a separate adhesive layer. The protective layer PL may protect the display panel DP by absorbing an external impact applied toward the rear surface of the display panel DP.

The protective layer PL may include a barrier layer BR, a high modulus protective portion HM, and a low modulus protective portion LM which are sequentially located on the rear surface of the display panel DP. In this specification, the high modulus protective portion HM may be defined as a first protective portion HM, and the low modulus protective portion LM may be defined as a second protective portion LM.

The barrier layer BR may come in contact with the rear surface of the display panel DP. The barrier layer BR may be formed directly on the rear surface of the base substrate BS through deposition. The barrier layer BR may include at least one inorganic film. For example, the inorganic film of the barrier layer BR may include at least one of aluminum oxide, titanium oxide, silicon oxide, silicon nitride, silicon oxynitride, zirconium oxide, or hafnium oxide. Because the barrier layer BR includes an inorganic film, the display panel DP may be protected from moisture/oxygen introduced from the outside.

The high modulus protective portion HM may be located on the rear surface of the barrier layer BR. The high modulus protective portion HM may come in contact with the barrier layer BR. The high modulus protective portion HM may be formed by directly applying the composition of the high modulus protective portion HM on the rear surface of the barrier layer BR.

The low modulus protective portion LM may be located on the rear surface of the high modulus protective portion HM. The low modulus protective portion LM may be formed directly on the rear surface of the high modulus protective portion HM so that it can come in contact with the high modulus protective portion HM. The low modulus protective portion LM may be spaced apart from the barrier layer BR with the high modulus protective portion HM interposed therebetween.

Each of the high modulus protective portion HM and the low modulus protective portion LM may overlap at least the entire display region DA of the display panel DP. Each of the high modulus protective portion HM and the low modulus protective portion LM may extend beyond the display region DA, and may overlap both the display region DA and the non-display region NDA. According to one or more embodiments of the present disclosure, each of the high modulus protective portion HM and the low modulus protective portion LM may overlap the entire rear surface of the display panel DP.

Within the protective layer PL, the high modulus protective portion HM may be located at an upper portion of the protective layer PL adjacent to the rear surface of the display panel DP. Within the protective layer PL, the low modulus protective portion LM may be located to be spaced farther apart from the rear surface of the display panel DP than the high modulus protective portion HM. Accordingly, the protective layer PL may have a high modulus in a region adjacent to the display panel DP along the thickness direction of the protective layer PL, and a low modulus in a region relatively far from the display panel DP. That is, the modulus of the upper surface of the protective layer PL facing the rear surface of the display panel DP may be greater than the modulus of the lower surface (or the rear surface) of the protective layer PL opposed to, and spaced apart from, the rear surface of the display panel DP.

The high modulus protective portion HM may have a first thickness T1, and the low modulus protective portion LM may have a second thickness T2. The characteristics of the protective layer PL may be adjusted by adjusting the thicknesses T1 and T2 of the high modulus protective portion HM and the low modulus protective portion LM. The first thickness T1 may be greater than the second thickness T2. For example, the second thickness T2 may be about 50% or less of the sum of the first thickness T1 and the second thickness T2. When the sum of the first thickness T1 and the second thickness T2 is about 100 um, the second thickness T2 may be about 50 um or less. Accordingly, the protective layer PL may have durability to absorb an external impact and protect the display panel DP. However, the first thickness T1 and the second thickness T2 are not necessarily limited to the above numerical examples.

The high modulus protective portion HM and the low modulus protective portion LM may be formed by coating with a resin, or through inkjet printing of a resin on the barrier layer BR. The high modulus protective portion HM and the low modulus protective portion LM may be formed by curing a resin applied on the barrier layer BR with the use of ultraviolet light or heat. Each of the high modulus protective portion HM and the low modulus protective portion LM may be coated by inkjet printing, and may contain a material (e.g., silicone or acrylic-based compound) that can be cured by heat or light.

The modulus of the high modulus protective portion HM may be greater than the modulus of the low modulus protective portion LM. The high modulus protective portion HM and the low modulus protective portion LM may be formed under different curing conditions. For example, the high modulus protective portion HM and the low modulus protective portion LM may contain a same material, but their respective curing conditions may be different from each other. Without being limited thereto, however, the high modulus protective portion HM and the low modulus protective portion LM may be formed by stacking resins containing different materials. That is, the high modulus protective portion HM may include a material that is different from a material included in the low modulus protective portion LM.

A degree of curing of a resin for forming the high modulus protective portion HM, and a degree of curing of a resin for forming the low modulus protective portion LM, may be different from each other. Depending on the degree of curing of the resin, the modulus of a protective portion may vary. The degree of curing of the resin may vary depending on temperature, irradiation time of ultraviolet light or heat, wavelength of light, intensity of light, energy of light, or the like. For example, when the energy of ultraviolet light irradiated to the resin is high, or when the resin is exposed to the ultraviolet light multiple times, the degree of curing is improved or increased, and the modulus of the cured resin may increase. That is, the high modulus protective portion HM may be cured by ultraviolet light having an energy that is higher than that of ultraviolet light irradiated to form the low modulus protective portion LM. Alternatively, the high modulus protective portion HM may be irradiated with ultraviolet light a greater number of times than the low modulus protective portion LM, and the high modulus protective portion HM may have a higher modulus than the low modulus protective portion LM. As long as the degree of curing of the high modulus protective portion HM is greater than that of the low modulus protective portion LM, the method of forming the protective layer PL is not limited to any one embodiment.

In addition, the modulus of the resin may vary depending on the degree of airtightness or depending on an atmosphere of the surrounding environment in which the resin is cured. For example, when the resin is cured in an environment with a high oxygen concentration, the oxygen concentration in the resin may increase during the curing process, or a chain length of a polymer in the resin may decrease, resulting in a decrease in modulus. When the resin is cured in an environment with a low oxygen concentration, the oxygen concentration in the resin may decrease during the curing process, or a chain length of a polymer may increase, resulting in an increase in modulus. For example, as the low modulus protective portion LM is formed by being cured in an environment with a relatively high oxygen concentration, and as the high modulus protective portion HM is formed by being cured in an environment with a relatively low oxygen concentration, the modulus of the low modulus protective portion LM may be less than the modulus of the high modulus protective portion HM. However, as long as the high modulus protective portion HM is formed so as to have a higher modulus than the low modulus protective portion LM, the method of forming the protective layer PL is not limited to any one embodiment.

According to forming conditions, a modulus may change according to a position in the third direction DR3 in the low modulus protective portion LM (e.g., there may be a variance in modulus in the low modulus protective portion LM). In the thickness direction of the protective layer PL, as a position in the low modulus protective portion LM becomes closer to the high modulus protective portion HM, and away from one surface of the low modulus protective portion LM defining the rear surface of the protective layer PL, the modulus according to the position in the low modulus protective portion LM may become greater. Similarly, the modulus may change according to a position in the high modulus protective portion HM in the third direction DR3. In this case, the average modulus of the high modulus protective portion HM may be greater than the average modulus of the low modulus protective portion LM.

However, the respective modulus of each of the high modulus protective portion HM and the low modulus protective portion LM may be constant according to a position in the thickness direction. The modulus according to a position in the high modulus protective portion HM in the thickness direction may be substantially uniform. That is, in the high modulus protective portion HM, the modulus of the high modulus protective portion HM at a portion in contact with, or closest to, the low modulus protective portion LM, and the modulus of the high modulus protective portion HM at a portion adjacent to the display panel DP, may be substantially the same as or similar to each other.

Accordingly, the amount of change in degree of modulus in the low modulus protective portion LM in the thickness direction may be greater than the amount of change in modulus in the high modulus protective portion HM in the thickness direction. For example, in the thickness direction, the degree of change in modulus in the low modulus protective portion LM may be about 1.5 times or more of the degree of change in modulus in the high modulus protective portion HM. However, the present disclosure is not limited thereto, and may vary depending on the forming conditions of the high modulus protective portion HM and the low modulus protective portion LM.

By having a low modulus at a lower portion of the protective layer PL to which an external impact may be applied, the protective layer PL may suitably absorb the external impact, thus reducing or minimizing the external impact applied to the display panel DP and the barrier layer BR. By having a high modulus at an upper portion of the protective layer PL adjacent to the display panel DP and the barrier layer BR, the durability of the protective layer PL may be supplemented. Through this, damage to the display panel DP may be reduced or prevented, and at the same time, damage to the barrier layer BR may be reduced or prevented, thus effectively blocking moisture or oxygen from entering the display panel DP from the outside.

Referring to FIG. 4B, the display module DM according to one or more embodiments of the present disclosure may further include an input-sensing layer ISL and an anti-reflection layer CFL. The input-sensing layer ISL and the anti-reflection layer CFL may be located on the display panel DP along the third direction DR3.

The input-sensing layer ISL may be located on the display panel DP. The input-sensing layer ISL may be located directly on the display panel DP. The input-sensing layer ISL may be formed on a base surface provided by the display panel DP. Here, the expression "the input-sensing layer ISL is located directly on the display panel DP" means that the input-sensing layer ISL is formed on the display panel DP through a continuous process, so that the input-sensing layer ISL and the display panel DP are coupled to each other without a separate adhesive layer. Without being limited thereto, however, the input-sensing layer ISL may be coupled to the display panel DP by an adhesive layer.

The input-sensing layer ISL may obtain the coordinate information of an external input applied from the outside of the display device DD (see FIG. 1). The input-sensing layer ISL may be driven in various ways to sense the external input applied from the outside of the display device DD (see FIG. 1). For example, the input-sensing layer ISL may be operated in a capacitive method, a resistive film method, an infrared method, a sound wave method, a pressure method, or the like and the present disclosure is not limited to any one method as long as the external input can be sensed.

The anti-reflection layer CFL may be located on the input-sensing layer ISL. For example, the anti-reflection layer CFL may be located directly on the input-sensing layer ISL. The anti-reflection layer CFL may be formed on a base surface provided by the input-sensing layer ISL. Without being limited thereto, however, the anti-reflection layer CFL may be coupled to the input-sensing layer ISL by an adhesive layer. In addition, although the anti-reflection layer CFL is illustrated as being located on the input-sensing layer ISL, as an example, the stacking order of the input-sensing layer ISL and the anti-reflection layer CFL is not limited to the illustrated one.

The anti-reflection layer CFL may reduce the reflectance of external light incident from above the display device DD (see FIG. 1). The anti-reflection layer CFL may include various embodiments that reduce the reflectance of external light.

The anti-reflection layer CFL according to one or more embodiments of the present disclosure may include a retarder and a polarizer. The retarder may include a $\lambda/2$ retarder and/or a $\lambda/4$ retarder. Each of the retarder and the polarizer may be a film type or a liquid crystal coating type. The film-type polarizer may include a stretchable synthetic resin film, and the liquid crystal coating-type polarizer may include liquid crystals arranged in an arrangement (e.g., predetermined arrangement). Without being limited thereto, the retarder and the polarizer may be implemented as one polarizing film.

The anti-reflection layer CFL according to one or more embodiments of the present disclosure may include a destructive interference structure. For example, the destructive interference structure may include a first reflective layer and a second reflective layer, which are located on different layers. First reflected light reflected from the first reflective layer, and second reflected light reflected from the second reflective layer, may destructively interfere with each other, and accordingly, the anti-reflection layer CFL may reduce the reflectance of external light.

The anti-reflection layer CFL according to one or more embodiments of the present disclosure may include color filters. The color filters may be located to correspond to the arrangement and light-emitting colors of the pixels PX (see FIG. 3) included in the display panel DP. The anti-reflection layer CFL may filter external light incident from above the display device DD (see FIG. 1) into colors corresponding to the light-emitting colors of the pixels PX (see FIG. 3). The anti-reflection layer CFL may further include a black matrix adjacent to the color filters.

Figure 5A:
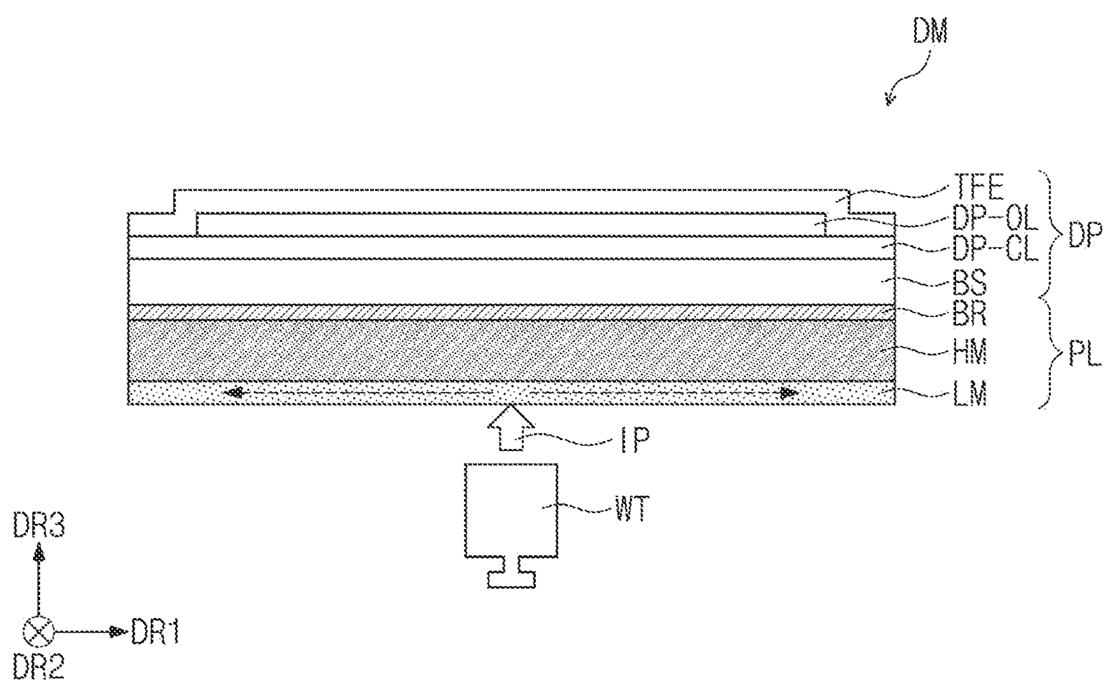
FIG. 5A is a cross-sectional view of a display module according to one or more embodiments of the present disclosure, to which an external impact is applied.
Figure 5B:
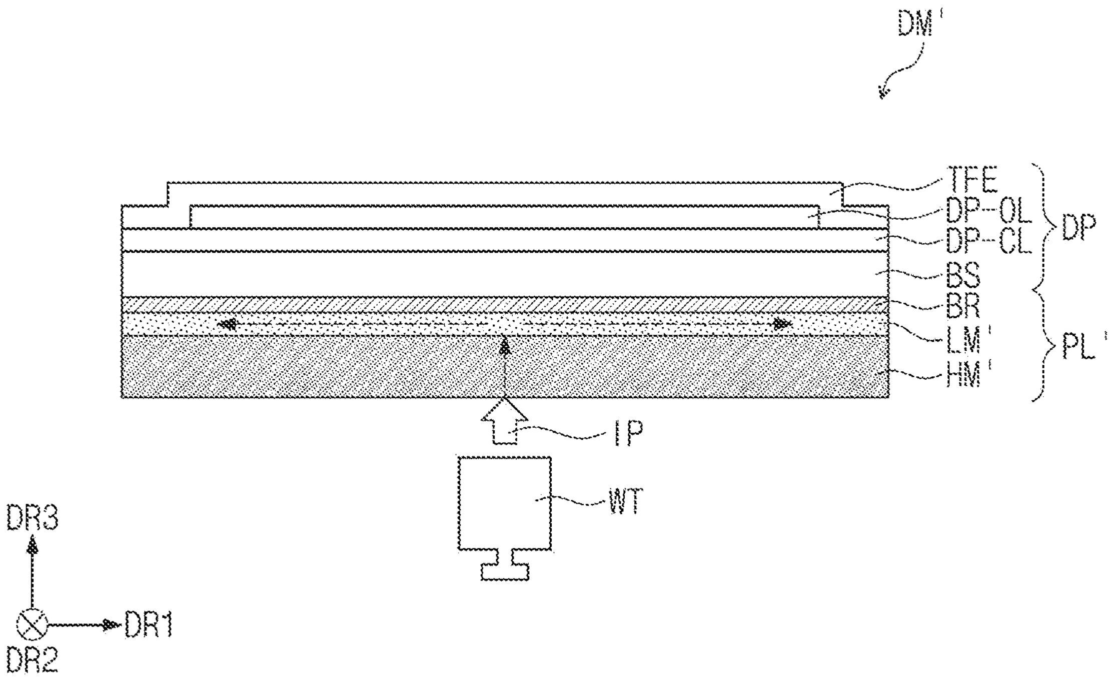
FIG. 5B is a cross-sectional view of a display module according to a comparative example of the present disclosure, to which an external impact is applied.

FIG. 5A is a cross-sectional view of the display module DM according to one or more embodiments of the present disclosure, to which an external impact IP is applied. FIG. 5B is a cross-sectional view of a display module DM' according to a comparative example, to which an external impact IP is applied. The display module DM illustrated in FIG. 5A corresponds to the display module DM illustrated in FIG. 4A, and the aforementioned description may be equally applied. FIGS. 5A and 5B schematically illustrate paths through which the external impact IP is transmitted within the protective layers PL and PL'.

Referring to FIG. 5A, an external object WT having a weight may apply the external impact IP to a lower portion of the display module DM. When the external impact IP is applied to the lower portion of the display module DM, the external impact IP may first be transmitted to the low modulus protective portion LM located at the lower portion of the protective layer PL. The low modulus protective portion LM may have better flexibility than the high modulus protective portion HM, may disperse the external impact IP in the horizontal direction (e.g., the first direction DR1 and the second direction DR2), and may absorb the external impact IP well, compared to the high modulus protective portion HM.

As the external impact IP applied to the low modulus protective portion LM is dispersed in the horizontal direction, the external impact IP, which is transmitted to the high modulus protective portion HM along the vertical direction (or thickness direction) parallel to the third direction DR3, may be reduced or minimized. Due to this, deformation of the high modulus protective portion HM may be reduced or minimized in the horizontal direction, and therefore, it is possible to reduce or prevent the likelihood of a phenomenon in which the barrier layer BR in contact with the high modulus protective portion HM is stretched and broken due to the deformation of the high modulus protective portion HM. In addition, as the low modulus protective portion LM and the high modulus protective portion HM sequentially absorb the external impact IP in the vertical direction, it is possible to reduce or minimize the external impact IP which is applied to the barrier layer BR and the display panel DP.

As the barrier layer BR is protected, and as the reliability of the barrier layer BR is improved, oxygen or moisture may be effectively blocked from entering the display panel DP from the outside, and the reliability of the display panel DP may be improved. In addition, as the protective layer PL has durability and absorbs the external impact IP well, it is possible to reduce or prevent the likelihood of damage to the display panel DP to thereby protect the display panel DP.

However, referring to FIG. 5B, the stacking order of the protective layer PL' included in the display module DM' according to the comparative example may be different from that of the protective layer PL according to the disclosed embodiments. The protective layer PL' according to the comparative example may include a low modulus protective portion LM' in contact with the rear surface of the barrier layer BR, and a high modulus protective portion HM' in contact with the rear surface of the low modulus protective portion LM'. Accordingly, in the protective layer PL' according to the comparative example, the low modulus protective portion LM' may be located at an upper portion of the protective layer PL' closer to the rear surface of the display panel DP, and the high modulus protective portion HM' may be located at a lower portion of the protective layer PL' spaced further apart from the rear surface of the display panel DP. That is, the upper portion of the protective layer PL' according to the comparative example may have a lower modulus, which is above the lower portion thereof of the protective layer PL'.

For example, the protective layer PL' according to the comparative example may include a barrier layer BR located below the base substrate BS of the display panel DP, a polymer film located below the barrier layer BR, and an adhesive layer bonding the polymer film and the barrier layer BR to each other. The adhesive layer having a lower modulus than the polymer film may correspond to the low modulus protective portion LM' according to the comparative example, and the polymer film having a higher modulus than the adhesive layer may correspond to the high modulus protective portion HM'.

Unlike embodiments of the present disclosure, in the comparative example, when an external object WT having a weight applies an external impact IP to the lower portion of the display module DM', the external impact IP may first be transmitted to the high modulus protective portion HM' located below the protective layer PL'. The external impact IP may be transmitted to the high modulus protective portion HM', which has lower flexibility than the low modulus protective portion LM', in the third direction DR3, which is a vertical direction (or thickness direction). Due to the external impact IP transmitted to the high modulus protective portion HM', the low modulus protective portion LM' may expand from an interface in contact with the high modulus protective portion HM'. Due to the deformation of the low modulus protective portion LM' to which the external impact IP is applied, the barrier layer BR adhered to the low modulus protective portion LM' may receive a tensile strength, and the barrier layer BR, which may be vulnerable to tension, may be easily broken.

In the comparative example, the barrier layer BR may be damaged by the external impact IP, and moisture or oxygen may easily enter the display panel DP from the outside due to the damaged barrier layer BR. In addition, in the comparative example, the external impact IP may be applied to the display panel DP due to damage to the barrier layer BR, thus causing damage to the display panel DP.

That is, as the protective layer PL' according to the comparative example includes the low modulus protective portion LM' located adjacent to the rear surface of the display panel DP and the high modulus protective portion HM' located at the lower portion of the protective layer PL', when the external impact IP is applied to the protective layer PL', the high modulus protective portion HM' transmits the external impact IP in the vertical direction so that the low modulus protective portion LM' and the barrier layer BR may be deformed or damaged. Accordingly, the display panel DP in the display module DM' according to the comparative example may be damaged by the external impact IP, and the reliability of the display panel DP may be deteriorated.

Table 1 below shows the results of pen drop evaluation of Comparative Example 1 and Experimental Examples 1 and 2. The protective layer of Comparative Example 1 may correspond to the protective layer PL' of FIG. 5B, and the protective layers of Experimental Examples 1 and 2 may correspond to the protective layer PL of FIG. 5A. In Table 1, the term "thickness" represents the thickness of the protective layer. Table 1 shows the percentage improvement of the pen drop evaluation results of Experimental Examples 1 and 2, as compared to the pen drop evaluation result of Comparative Example 1, when the pen drop evaluation result of Comparative Example 1 is 100%.

TABLE 1

| | Comparative Example 1 | Experimental Example 1 | Experimental Example 2 |
|---|---|---|---|
| Thickness (um) | 55 | 40 | 60 |
| Pen drop evaluation | 100% | 140% | 140~160% |

Referring to Table 1, it can be confirmed that the pen drop evaluation results of Experimental Example 1 and Experimental Example 2 are improved when compared to that of Comparative Example 1. For example, when the height of the pen drop damaging the display module in Comparative Example 1 is about 5 cm, the height of the pen drop damaging the display module in Experimental Example 1 may be about 7 cm, and the height of the pen drop damaging the display module in Experimental Example 2 may be about 7-8 cm.

Referring to Experimental Examples 1 and 2, as the thickness of the protective layer increases, both the pen drop evaluation result and the durability of the protective layer may be improved. By adjusting the thickness of the protective layer, the mechanical strength of the protective layer required by the display module may be adjusted.

Referring to Experimental Example 1 and Comparative Example 1, it can be confirmed that, although Experimental Example 1 has a thinner protective layer than Comparative Example 1, the pen drop evaluation result of Experimental Example 1 is improved compared to that of Comparative Example 1. Accordingly, the protective layer according to one or more embodiments of the present disclosure may improve durability by including a low modulus protective portion at the lower portion thereof and a high modulus protective portion at the upper portion thereof.

Figure 6A:
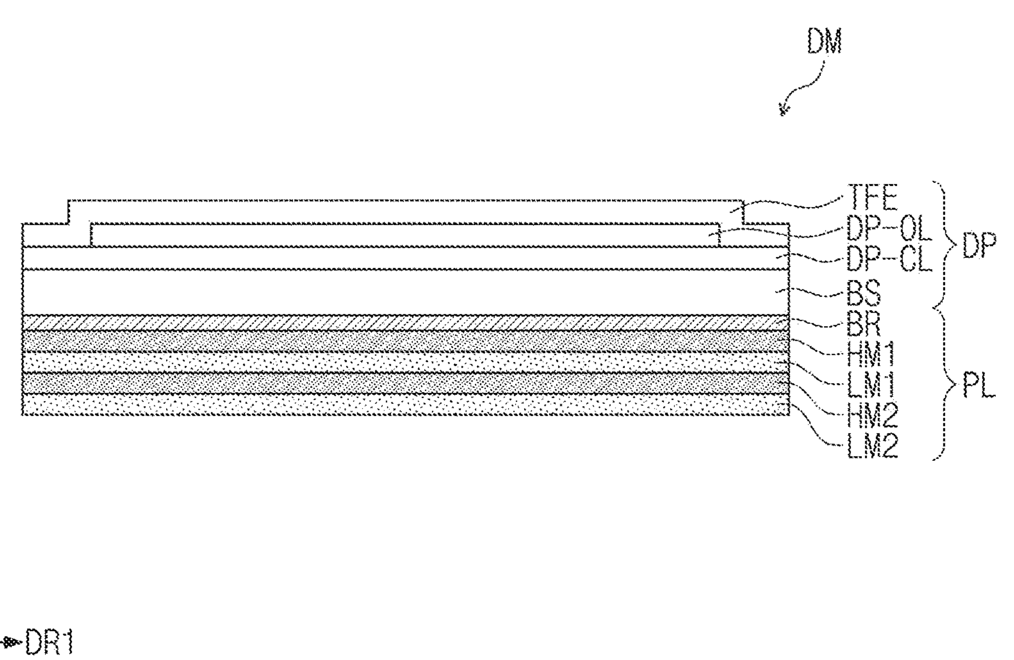
FIGS. 6A to 6C are cross-sectional views of a display module according to one or more embodiments of the present disclosure.
Figure 6B:
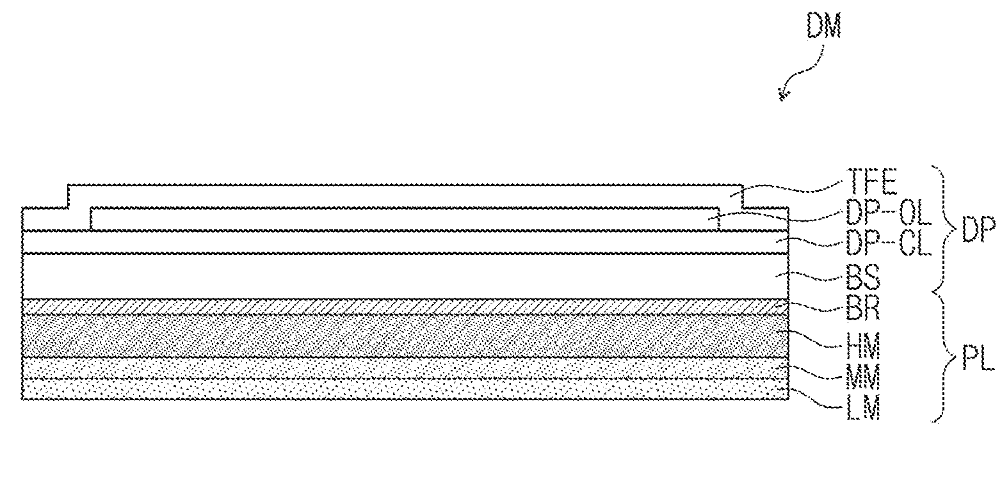
Figure 6B:
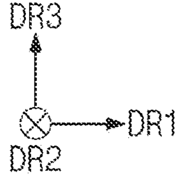
Figure 6C:
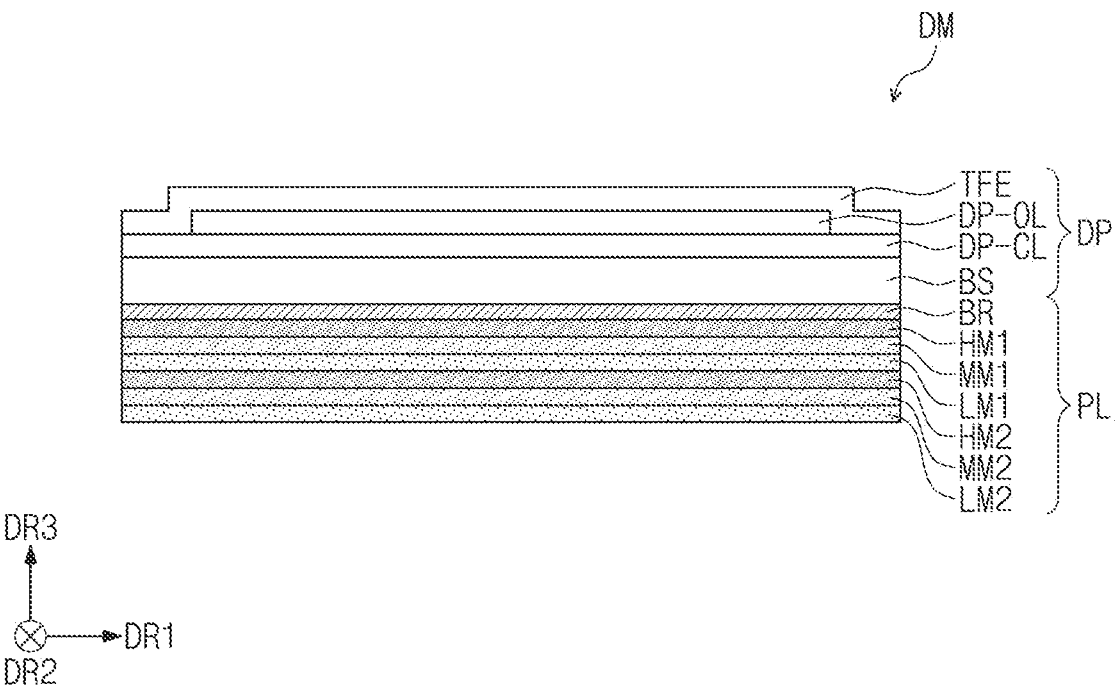

FIGS. 6A to 6C are cross-sectional views of a display module DM according to one or more embodiments of the present disclosure. The components of the display modules DM of FIGS. 6A to 6C are substantially the same as those of the display module DM described above, but the components of the protective layer PL are partially different. Hereinafter, the differences between the embodiments will be mainly described.

Referring to FIG. 6A, the protective layer PL may include a plurality of high modulus protective portions HM1 and HM2 and a plurality of low modulus protective portions LM1 and LM2. In one or more embodiments of the present disclosure, the high modulus protective portions HM1 and HM2 may include first and second high modulus protective portions HM1 and HM2, and the low modulus protective portions LM1 and LM2 may include first and second low modulus protective portions LM1 and LM2.

On the rear surface of the display panel DP, the first high modulus protective portion HM1, the first low modulus protective portion LM1, the second high modulus protective portion HM2, and the second low modulus protective portion LM2 may be sequentially located. That is, the first and second high modulus protective portions HM1 and HM2 and the first and second low modulus protective portions LM1 and LM2 may be alternately located in the thickness direction.

The rear surface of the protective layer PL corresponds to the rear surface of the second low modulus protective portion LM2 and, therefore, may have a low modulus. Accordingly, when an external impact is applied to the lower portion of the display module DM, the second low modulus protective portion LM2 may absorb the external impact. The first high modulus protective portion HM1 is located at the upper position of the protective layer PL adjacent to the barrier layer BR and therefore, may have a high modulus. Accordingly, the durability of a portion of the protective layer PL adjacent to the rear surface of the display panel DP may be improved, and the protective layer PL may protect the display panel DP.

The low modulus protective portions LM1 and LM2 located in the protective layer PL may effectively absorb and disperse the external impact applied to the protective layer PL, and the high modulus protective portions HM1 and HM2 may reduce or prevent the deformation of the protective layer PL, and may improve the durability thereof. Meanwhile, the number of high modulus protective portions and low modulus protective portions is not limited to those illustrated in the drawing, and the protective layer PL may include a greater number of high modulus protective portions and low modulus protective portions.

Referring to FIG. 6B, the protective layer PL may further include an intermediate modulus protective portion MM. In this specification, the intermediate modulus protective portion MM may be defined as a third protective portion MM.

The intermediate modulus protective portion MM may be located between the high modulus protective portion HM and the low modulus protective portion LM. The intermediate modulus protective portion MM may come in contact with each of the rear surface of the high modulus protective portion HM, and the upper surface of the low modulus protective portion LM. The intermediate modulus protective portion MM may have a lower modulus than the high modulus protective portion HM, and may have a higher modulus than the low modulus protective portion LM.

As described above, the intermediate modulus protective portion MM may have a modulus value that is between the modulus values of the high modulus protective portion HM and the low modulus protective portion LM by adjusting the curing degree or curing conditions of the resin. For example, the intermediate modulus protective portion MM may be formed by making its curing degree lower than that of the high modulus protective portion HM, and by making its curing degree higher than that of the low modulus protective portion LM.

The intermediate modulus protective portion MM may include the same material as at least any one of the high modulus protective portion HM or the low modulus protective portion LM, and may be formed under curing conditions that are different from those of the high modulus protective portion HM and the low modulus protective portion LM. Without being limited thereto, however, the intermediate modulus protective portion MM may include a material that is different from that included in each of the high modulus protective portion HM and the low modulus protective portion LM. As long as the modulus of the intermediate modulus protective portion MM has a value between the modulus of the high modulus protective portion HM and the modulus of the low modulus protective portion LM, the material and forming method of the intermediate modulus protective portion MM is not limited to any one embodiment.

The intermediate modulus protective portion MM may reduce a difference in modulus at an interface between the high modulus protective portion HM and the low modulus protective portion LM. Accordingly, the modulus of the protective layer PL may gradually increase as the protective layer PL becomes closer to the rear surface of the display panel DP in the thickness direction. Due to this, the external impact applied to the protective layer PL may be gradationally absorbed, and stress concentration and delamination may be reduced or prevented at the interface between the high modulus protective portion HM and the low modulus protective portion LM, which have a large difference in modulus therebetween.

Referring to FIG. 6C, the protective layer PL may include a plurality of high modulus protective portions HM1 and HM2, a plurality of intermediate modulus protective portions MM1 and MM2, and a plurality of low modulus protective portions LM1 and LM2. The high modulus protective portions HM1 and HM2 may include first and second high modulus protective portions HM1 and HM2, the intermediate modulus protective portions MM1 and MM2 may include first and second intermediate modulus protective portions MM1 and MM2, and the low modulus protective portions LM1 and LM2 may include first and second low modulus protective portions LM1 and LM2.

On the rear surface of the display panel DP, the first high modulus protective portion HM1, the first intermediate modulus protective portion MM1, the first low modulus protective portion LM1, the second high modulus protective portion HM2, the second intermediate modulus protective portion MM2, and the second low modulus protective portion LM2 may be sequentially located. That is, on the rear surface of the display panel DP, the protective portions may be alternately located in the order of the high modulus protective portion, the intermediate modulus protective portion, and the low modulus protective portion.

The rear surface of the protective layer PL corresponds to the rear surface of the second low modulus protective portion LM2 and, therefore, may have a low modulus. The first high modulus protective portion HM1 is located at the upper portion of the protective layer PL adjacent to the barrier layer BR, and may have a high modulus. The intermediate modulus protective portions MM1 and MM2 may be respectively located between the high modulus protective portions HM1 and HM2 and the low modulus protective portions LM1 and LM2 to reduce a difference in modulus between the protective portions, and to absorb and disperse the external impact.

The low modulus protective portions LM1 and LM2 and the intermediate modulus protective portions MM1 and MM2 located in the protective layer PL may gradationally absorb and disperse the external impact applied in the protective layer PL, and the high modulus protective portions HM1 and HM2 may improve the durability of the protective layer PL. Meanwhile, the number of high modulus protective portions, intermediate modulus protective portions, and low modulus protective portions is not limited to those illustrated in the drawing, and the protective layer PL may include a larger number of high modulus protective portions, intermediate modulus protective portions, and low modulus protective portions.

The display device according to one or more embodiments of the present disclosure includes a protective layer located below a display panel to protect the display panel. The protective layer according to one or more embodiments of the present disclosure has a high modulus at an upper portion thereof, adjacent to the display panel, and has a low modulus at a lower portion thereof, thereby being able to absorb an external impact applied to the rear surface of the display panel, and to improve the durability and reliability of the display device.

Although embodiments have been described with reference to the above embodiments, those skilled in the art will understand that various modifications and changes can be made without departing from the spirit and scope of the present disclosure described in the following claims.

Therefore, the technical scope of the present disclosure should not be limited to the contents described in the detailed description of the specification, but should be determined by the claims below, with functional equivalents thereof to be included therein.

What is claimed is:

1. A display device comprising:
a display panel; and
a protective layer contacting a rear surface of the display panel, and comprising:
a high modulus protective portion on the rear surface of the display panel; and
a low modulus protective portion spaced from the rear surface of the display panel with the high modulus protective portion interposed therebetween, and having a variance in modulus in a thickness direction of the protective layer that is greater than a variance in modulus in the high modulus protective portion in the thickness direction.

2. The display device of claim 1, wherein the low modulus protective portion contacts a rear surface of the high modulus protective portion.

3. The display device of claim 1, wherein the high modulus protective portion and the low modulus protective portion comprise an organic material.

4. The display device of claim 3, wherein the high modulus protective portion and the low modulus protective portion comprise a same material, and
wherein a degree of curing of the high modulus protective portion is different from a degree of curing of the low modulus protective portion.

5. The display device of claim 1, wherein a thickness of the low modulus protective portion is about 50% or less than a sum of a thickness of the high modulus protective portion and the thickness of the low modulus protective portion.

6. The display device of claim 1, wherein the variance in modulus in the low modulus protective portion is about 1.5 times greater than the variance in modulus in the high modulus protective portion.

7. The display device of claim 1, wherein the high modulus protective portion and the low modulus protective portion are provided in plurality, and wherein the high modulus protective portions and the low modulus protective portions are alternately arranged on the rear surface of the display panel.

8. The display device of claim 7, wherein one of the low modulus protective portions defines a rear surface of the protective layer.

9. The display device of claim 1, wherein the protective layer further comprises a barrier layer comprising an inorganic material, and contacting the high modulus protective portion and the rear surface of the display panel.

10. The display device of claim 1, wherein the protective layer further comprises an intermediate modulus protective portion between the high modulus protective portion and the low modulus protective portion, and having a modulus that is less than a modulus of the high modulus protective portion, and greater than a modulus of the low modulus protective portion.

11. The display device of claim 10, wherein the high modulus protective portion, the intermediate modulus protective portion, and the low modulus protective portion are provided in plurality, and wherein the high modulus protective portions, the intermediate modulus protective portions, and the low modulus protective portions are alternately arranged on the rear surface of the display panel along the thickness direction.

12. The display device of claim 1, wherein the display panel comprises:

a base substrate;

pixels above the base substrate; and an encapsulation layer above the pixels.

13. The display device of claim 12, wherein the base substrate comprises a synthetic resin layer.

14. The display device of claim 1, further comprising an input-sensing layer above the display panel.

15. The display device of claim 1, further comprising a color filter layer above the display panel.

16. A display device comprising:

a flexible base substrate comprising an upper surface and a rear surface;

light-emitting elements above the upper surface of the flexible base substrate;

a barrier layer contacting the rear surface of the flexible base substrate, and comprising an inorganic material;

a first protective portion contacting the barrier layer, and comprising an organic material; and a second protective portion below the first protective portion, and comprising an organic material, wherein a modulus of the second protective portion is less than a modulus of the first protective portion, and increases along a thickness direction of the second protective portion toward the first protective portion.

17. The display device of claim 16, wherein a thickness of the second protective portion is about 50% or less than a sum of a thickness of the first protective portion and the thickness of the second protective portion.

18. A display device comprising:

a display panel; and a protective layer contacting a rear surface of the display panel, and comprising:

an upper portion below the rear surface of the display panel; and a lower portion below the upper portion, defining a rear surface of the protective layer, and having a lower modulus than a modulus of the upper portion, wherein the modulus of the lower portion or the modulus of the upper portion changes along a thickness direction of the protective layer.

* * * * *